United States Patent [19]
Baldwin et al.

[11] Patent Number: 5,204,976
[45] Date of Patent: Apr. 20, 1993

[54] RECEIVERS FOR MOBILE TELEPHONE SYSTEMS

[75] Inventors: Andrew W. Baldwin, Woodley; Robert N. Carter, Reading, both of United Kingdom

[73] Assignee: Orbitel Mobile Communications Limited, Bracknell, United Kingdom

[21] Appl. No.: 685,816

[22] Filed: Apr. 15, 1991

[30] Foreign Application Priority Data

May 1, 1990 [GB] United Kingdom ............... 9009814

[51] Int. Cl.⁵ .............................................. H04B 1/06
[52] U.S. Cl. .............................. 455/234.2; 455/235.1; 455/247.1; 375/98
[58] Field of Search ............... 455/234, 241, 239, 249, 455/234.1, 234.2, 235.1, 246.1, 247.1, 47, 52.3, 241.1, 239.1, 249.1; 375/97, 98

[56] References Cited

U.S. PATENT DOCUMENTS

| | | | |
|---|---|---|---|
| 3,619,660 | 11/1971 | Rugo | 307/264 |
| 4,499,586 | 2/1985 | Cafarella et al. | 455/239 |
| 4,546,326 | 10/1985 | Van Offelen et al. | 455/234 |
| 4,625,240 | 11/1986 | Yablonski | 375/98 |
| 4,631,738 | 12/1986 | Betts et al. | 375/98 |
| 4,635,103 | 1/1987 | Steckler et al. | 358/27 |
| 4,654,879 | 3/1987 | Goldman et al. | 455/33 |
| 4,829,593 | 5/1989 | Hara | 455/234 |
| 4,989,074 | 1/1991 | Matsumoto | 455/234 |

FOREIGN PATENT DOCUMENTS

0117662 5/1984 European Pat. Off. .
0372759 6/1990 European Pat. Off. .

Primary Examiner—Reinhard J. Eisenzopf
Assistant Examiner—Timothy H. Keough
Attorney, Agent, or Firm—Leydig, Voit & Mayer

[57] ABSTRACT

A receiver for a mobile telephone system, the receiver having a gain control coupled to receive an input burst signal and being switchable in response to the value of a gain control signal between a plurality of gain values. A detector for detecting the amplitude of said input burst signal, an averager for storing the value of the detected amplitude and a timer operative in response to the detection of said input signal for timing a sequence of measurements of the amplitude of the input burst signal, said averager being operative to compute an average value of the amplitude and to provide a corresponding gain control signal for a subsequent time period.

15 Claims, 3 Drawing Sheets

RECEIVERS FOR MOBILE TELEPHONE SYSTEMS

BACKGROUND OF THE INVENTION

1. Field of the Invention

This invention relates to receivers for mobile telephone systems.

With the impending adoption of the GSM (Groupe Speciale Mobile) system for a Pan-European mobile Telephone System (see for example Electronics and Communication Engineering Journal Jan./Feb. 1989 vol. 1 no. 2 pp. 7 to 13, "Pan-European cellular radio", D. M. Balston), a number of difficult technical problems have to be overcome for satisfactory implementation of the system.

In the GSM system, data to be transmitted is modulated on to a 900 MHz carrier by a Gaussian minimum shift keying technique (GMSK). Frequency channels are provided at a spacing of 200 KHz, and data is transmitted on each channel at a total rate of 270.833 kbits$^{-1}$.

2. Description of the Prior Art

Referring to FIG. 1, this shows the basic format of one frequency channel for GSM transmissions as comprising a series of frames (Time Domain Multiple Access Frames), each frame comprising eight multiplexed time slots from different mobile stations. Each frame is 4.615 ms in length and each time slot 0.577 ms in length. The structure of a time slot as shown comprises two sections of data separated by control bits, tail bits etc. Data is transmitted from each mobile station within a time slot in compressed format at a rate of approximately 13 kbits$^{-1}$.

Given the very tight technical constraints of the GSM system, interference and data loss and corruption can easily occur.

Problems arise in the receiver for the GSM terminal, whether it be a terminal in a mobile station or in a base station. Firstly, the strength of the signal received by the terminal will vary and the input dynamic range may be as large as 100 dB. This is because, in the case of a mobile station, it must not only receive data signals from the adjacent base station but must also monitor neighboring base stations during time slots of the frame not reserved for data transmission for hand over purposes. Hence it is necessary to adjust the gain by very large amounts from time slot to time slot, i.e. within 0.577 ms. Conventional methods of automatic gain control can not cope with such extreme demands. Secondly, received signals at whatever level they are received must be amplified to a suitable level so that they can be accommodated within the input dynamic range of an analog to digital converter (ADC) system which follows the IF stage. Since the dynamic range of an ADC is relatively small, it is necessary to adjust the gain of the system so that each incoming pulse of RF energy is at an appropriate level.

It is proposed in accordance with the invention disclosed in co-pending U.K. Patent Application No. GB2233846A to provide a receiver for a mobile telephone system operating in a time division multiple access (TDMA) system, the receiver having a gain control means coupled to receive an input signal and being switchable under the control of digital control signals between a plurality of gain and/or attenuation levels, equalizer means coupled to receive the output signal from the gain control means and means for determining the value of the input signal and for providing said digital control signals to fix the gain or attentuation level constant for a time slot of the TDMA system, the period, the determining means including means for recording previous values of the input signal to fix the gain level prior to said time slot based upon an assessment of said previous values.

The receiver disclosed and claimed in co-pending U.K. Patent Application No. GB2233846A operates satisfactorily for traffic channels, and is intended for use in a GSM mobile terminal. However, whilst similar problems occur in a base station receiver, further problems arise in addition requiring a different approach to AGC control.

Problems arise in particular in the base station when a mobile station wishes to gain access in order to initiate a call. In order to gain access, the GSM system provides a random access channel (uplink from the mobile to the base station) which is used by the mobile to request access. An access grant channel (downlink only) is also provided, which replies to a random access and assigns a dedicated control signal for subsequent signalling. The structure of a random access channel is shown in FIG. 2, as comprising a start sequence of eight bits, followed by a fixed preamble for the equalizer section of the base station, a data I.D. section, and a long guard period. Such a guard period is necessary since the mobile may not be synchronized with the base station, and since the mobile may be as far as 35 km from the base station, there may be substantial propagation delays (240 microsecond loop delay) so that the data may arrive at the base station at any time within the random access channel slot. When an access request is detected by the base station, the base station can reply on the access grant channel to correct the timing of the mobile and assign a dedicated control signal.

Problems arise however since the power level of the access request at the base station receiver antenna is unknown and may have a wide variation between −104 dB milliwatt and 0 dB milliwatt. The power level must be brought very quickly within the range of an ADC, to a central region of a 30 dB window for the ADC. In addition, more than one mobile may request access during a single random access channel, in which case it is necessary to resolve the contention between the requests.

SUMMARY OF THE INVENTION

It is an object of the invention to overcome the above noted problem.

The present invention provides a receiver for a mobile telephone system, the receiver having a gain control means coupled to receive an input burst signal, and being switchable in response to the value of a gain control signal between a plurality of gain values, detector means for detecting the amplitude of said input burst signal, averaging means for storing the value of the detected amplitude and timing means operative in response to the detection of said input signal for timing a sequence of measurements of the amplitude of the input burst signal, said averaging means being operative to compute an average value of the amplitude and to provide a corresponding gain control signal for a subsequent time period.

Thus, in accordance with the invention, the gain level (whether it be a positive gain or a negative gain, i.e. attenuation) can be adjusted to an appropriate level based upon an average value of a sequence of measurements, and therefore represents a relatively accurate estimate for a subsequent time Period.

As preferred, said detector means comprises a fast acting logarithmic amplifier for providing an output signal to an analog to digital converter (ADC). As preferred, the output of the detector means is sampled under the control of said timing means at frequent intervals during an input signal burst. In the case of an access burst in the GSM system, the input signal, which may be the input RF signal or an IF signal, is sampled at the beginning of the burst, i.e. a channel slot lasting 156.25 bits. Each bit occupies about 3.5 microseconds, and hence a measurement cycle is made on a single input bit in a period less than 3.5 microseconds. In the case of an access burst, eight consecutive measurements are made on the initial start sequence of 8 bits, and an average value is computed with said averaging means, in order to set the gain value for the remainder of the access burst.

As preferred, the detector means includes a step detector means which is operative to detect a step in signal strength of a Predetermined amount (n dB), representing the start of a burst signal, in order to actuate a counter and timing mechanism, in order to generate the timing sequence for the consecutive measurements of signal amplitude.

The situation frequently occurs where more than one mobile may request access during a single random access time slot. In order to resolve contention, the present invention in a preferred feature provides that said step detector means, having initiated operation of a measurement sequence and detecting a subsequent step increase in signal strength, say n dB above the previous signal strength, representing a further mobile requesting access but being closer to the base station, that the step detector means is operative to reset the timing means, to reset the accumulator means and to restart the measurement sequence based upon the stronger signal. In this way contention between the stations is resolved. Clearly, if a third mobile requests access during the same time slot with an even stronger signal n dB above the current signal, then the timing means is reset yet again: the statistical probability of this happening however, is less.

In the case of a traffic burst or slot, the system having been prepared for reception of data, the gain value is set from an estimate formed in one or more previous access bursts or traffic slots, measurements having been made by means of said averaging means and timing means throughout the previous traffic slot(s) in order to form an average value to provide an estimate of gain for the next traffic slot, i.e. the current slot. As preferred, processor means is provided for computing a gain estimate based upon the previous ten traffic slots for that channel.

BRIEF DESCRIPTION OF THE DRAWINGS

One embodiment of the invention will now be described, by way of example only, with reference to the accompanying drawings wherein.

DESCRIPTION OF THE PREFERRED EMBODIMENT

Figure 3:
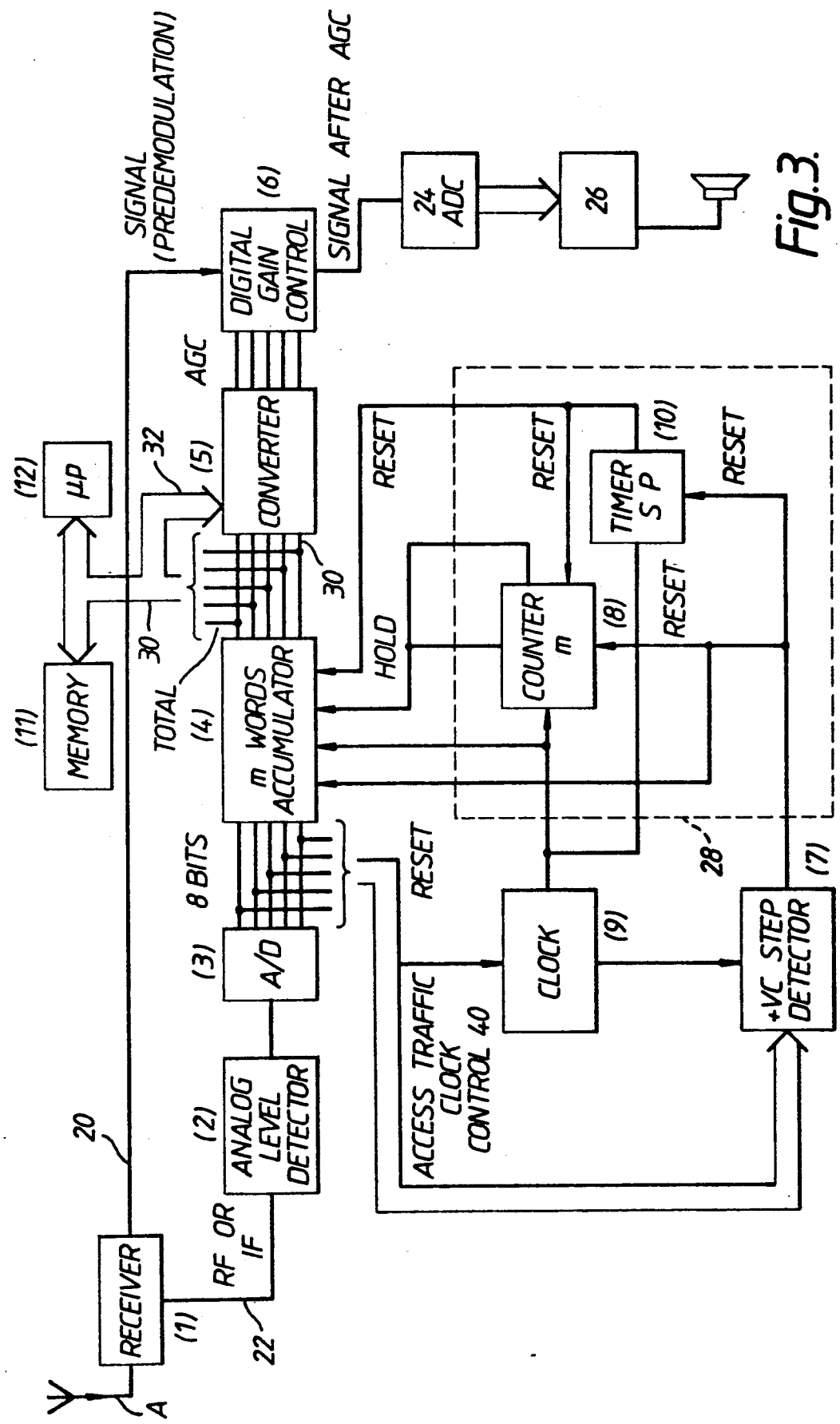
FIG. 3 is a block diagram of the embodiment of the AGC system for a GSM base station in accordance with the invention.

Referring now to FIG. 3, there is shown part of a receiver system for the base station of a GSM system as comprising an antenna A, coupled to a receiver stage 1 which may comprise an input RF stage for preamplifying and processing the RF signal or may include in addition an IF stage for providing the intermediate frequency IF signal for subsequent processing. In either case the RF or IF signals are provided on lines 20, 22, the signal on line 20 being applied to a digital gain control unit 6 which is operative to provide automatic gain control to the signal on line 20 to adjust the gain of the signal to an appropriate level at which it is located near the optimum point of a 30 dB window for an analog to digital control 24 which provides a digital version of the signal to an equalizing and decoding section 26.

The signal on line 22 is applied to an analog level detector 2 which comprises a fast acting logarithmic amplifier, the output of which is applied to a flash analog to digital converter 3 which provides an 8 bit digital output which is fed to an accumulator 4 and to a step detector unit 7. Step detector 7 is arranged to detect an increase in signal level strength occurring as a step (i.e. within one clock cyle of the system) and the step detector is arranged to be presettable to detect a step of any desired amount, for example 3 dB. The output of step detector 7 is coupled to initiate operation of a counting and timing mechanism 28, indicated in dotted lines.

Counting and timing mechanism 28 provides control signals to accumulator 4 to enable it to store m words, i.e. output values from ADC 3, and to compute an average value of the stored m words which is provided on an output bus 30. The average value on bus 30 is provided to a converter 5 which may for example comprise a look-up table in ROM, the output of converter 5 providing a gain control signal to digital gain control unit 6. Digital gain control unit 6 may take any convenient form, for example a cascaded array of switched attenuator networks and/or operational amplifiers. The output bus 30 is also coupled to a memory store 11 and a microprocessor 12.

A clock unit 9, working primarily at the data bit rate for an access burst, is provided providing clock signals to step detector 7, accumulator 4 and to counting and timing unit 28. Counting and timing unit 28 includes a counter 8 and a timer 10 coupled to receive clock signals from unit 9. Counter 8 is arranged to count to a total m (as preferred 8), the same number as the number of words storable in accumulator 4. Counter 8 is arranged to provide a hold control signal to accumulator 4. Timer 10 is arranged to provide a reset control signal to counter 8 and accumulator 4 following the lapsing of a time period equivalent to 1 time slot of the GSM system, i.e. 156.25 microseconds.

Figure 1:
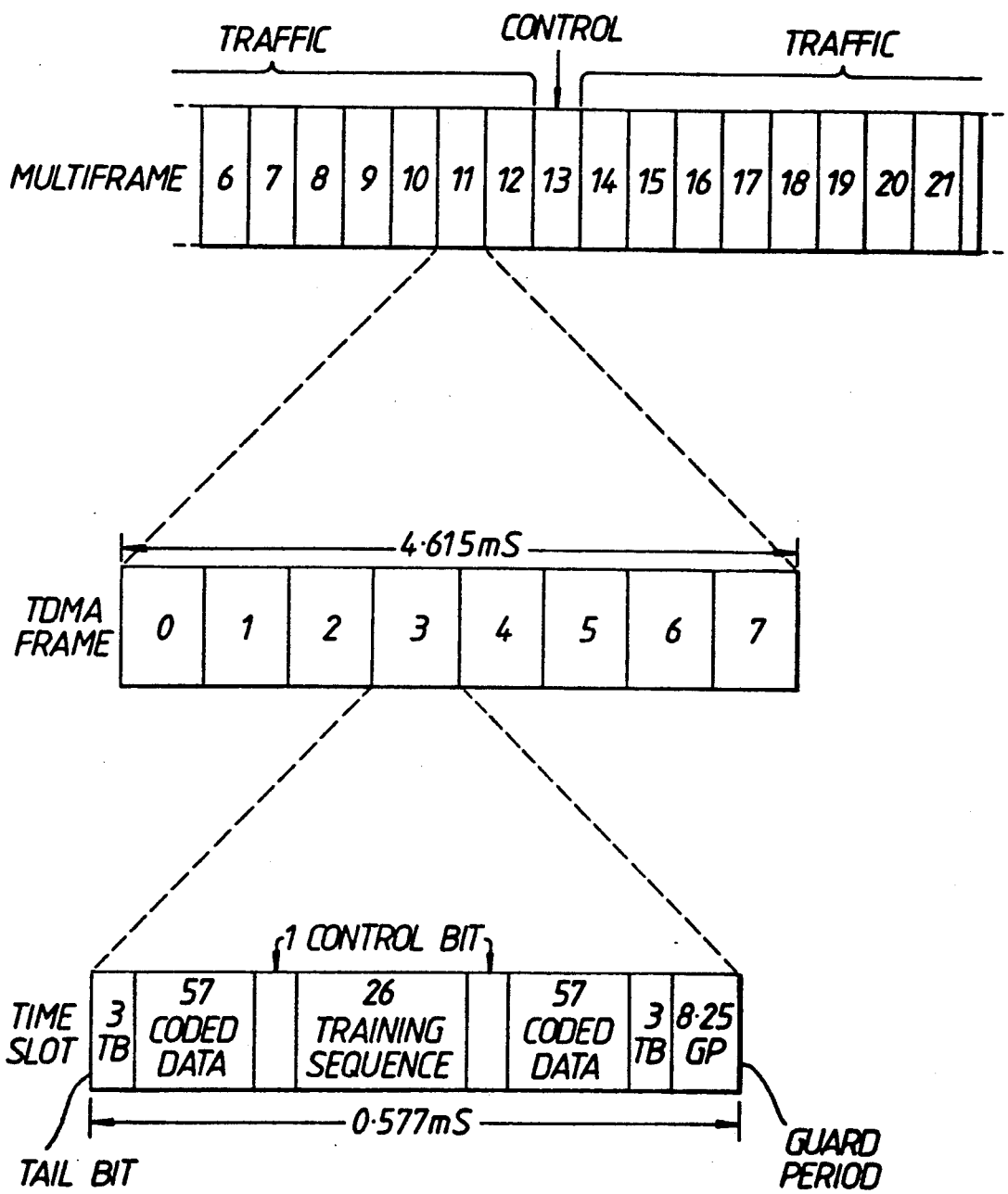
FIG. 1 is a schematic view of the TDMA format for the GSM system.
Figure 2:
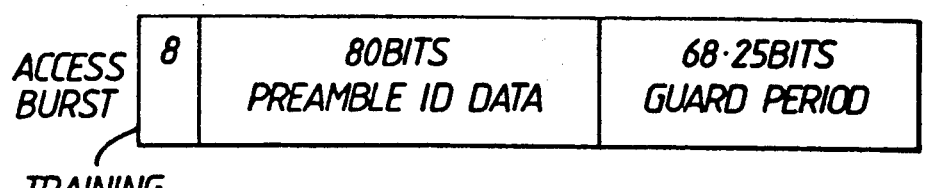
FIG. 2 is a schematic view of the format for the uplink random access channel in the GSM system.
Figure 4:
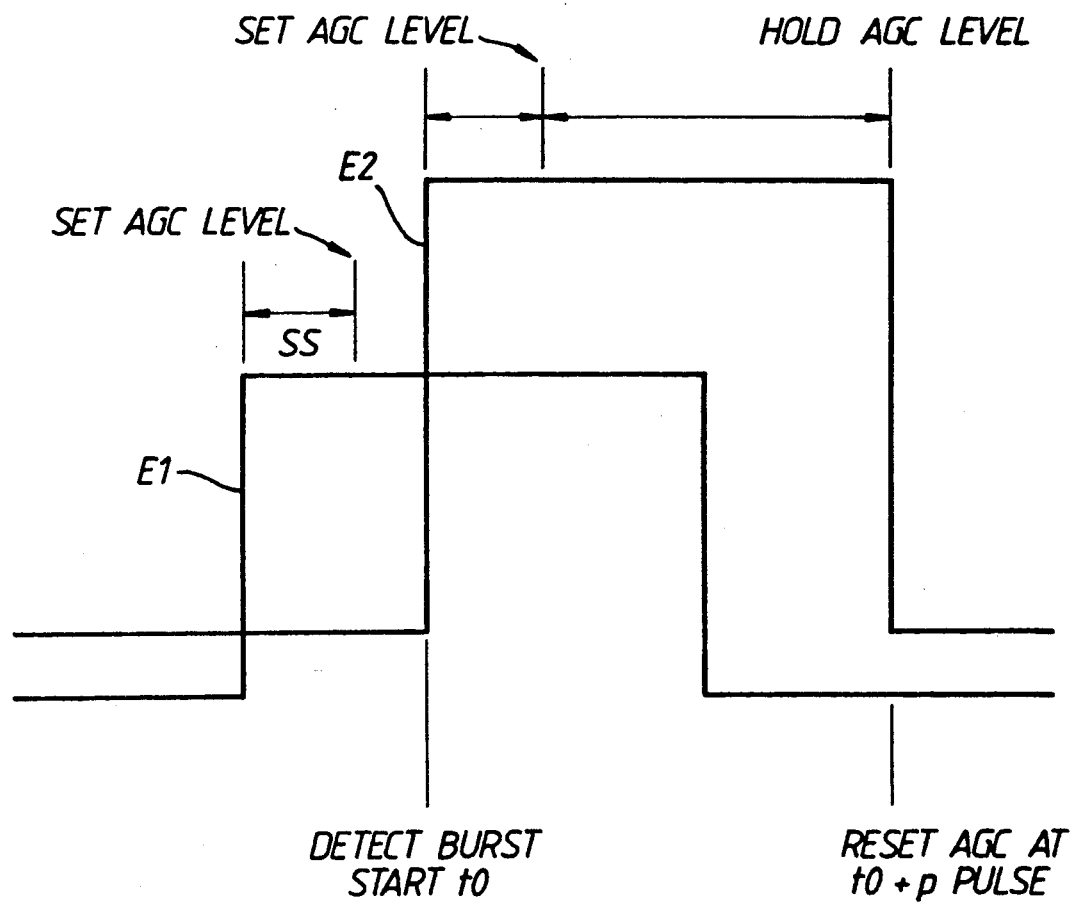
FIG. 4 is a waveform diagram illustrating the way in which the AGC system of FIG. 3 resolves contention between two mobiles competing for access during a random access channel slot.

In operation of the AGC system shown in FIG. 3, the operation during a random access channel of the form shown in FIG. 2 will first be described with reference to FIG. 4. Since the timing of a mobile station wishing to gain access to the base station will not be synchronized with that of the base station, the access burst may arrive at the base station at any time during the random access slot. As and when an access burst arrives at the base station, the access burst is Processed in receiver stage 1 and the RF or IF level is detected in logarithmic amplifier 2, the arrival of the access burst providing a step increase in signal level which is detected by step detector 7. The overall envelope of the access burst is shown in FIG. 4 as E1. Assuming that the step increase in signal level strength is sufficient, say 3 dB, step detector 7 provides an output signal to permit counter 8 and timer 10 to initiate a counting and timing sequence. In this sequence, the output of ADC 3 is stored as a first word in accumulator 4 under the control of clock 9. This cycle of operation takes about 2.5 microseconds, and mechanism 28 is accordingly prepared for the next bit of the initial 8 bit start sequence of the random access burst, which occurs 3.5 microseconds after the initial bit. Accordingly, clock 9 is operative to permit a second word to be stored in accumulator 4 representing the output of ADC 3 which is at this time sampling the value of the second bit of the training sequence. At the same time, counter 8 is incremented to step the words within the accumulator. The sequence is repeated for all 8 bits of the initial training sequence of the random access burst shown as the interval SS in FIG. 4. When counter 8 reaches its maximum value, namely 8, it provides a hold signal to accumulator 4 and accumulator 4 provides an output on bus 30 representing the average value of the 8 word values stored in accumulator 4. This value is held on bus 30 for the remainder of the random access time slot as determined by timer 10. Converter 5 acts to convert the averaged value on bus 30 to a digital gain control signal which is applied to gain control 6 in order to adjust the signal strength of the input signal on line 20 to the mid-point of the input window for ADC 24. In an alternative construction, if the output on bus 30 is appropriate, it can be applied directly to digital gain control unit 6 for direct control of the gain level.

If during a random access channel after the initiation of operation of counting and timing mechanism 28 following reception of a first random access burst, a second random access burst indicated in FIG. 4 as E2 is detected, then if the signal strength of second random access burst E2 has a value which is n dB greater than E1, say 3 dB, then this step increase at time t0 is detected by a step detector 7 which is operative to provide an output signal to reset timer 10, counter 8 and accumulator 4. Accordingly, the counting and timing mechanism 28 initiates a second counting and timing cycle from time t0 to an interval t0+p based upon the signal values of the second random access burst E2 in exactly the same manner as described above. At time t0+p, timer 10 times out in order to reset accumulator 4 and counter 8. Accumulator 4 is then operative to set gain control unit 6 to a maximum value. In this way, contention between two mobiles requesting access to the base station is resolved, access being granted to the mobile with the greater signal strength.

After access has been granted to a particular mobile and the gain levels set in order to permit correct operation of the equalizing and decoding section 26, then the base station is set up for reception of a traffic channel from the mobile to which access has been granted. As described above, it is necessary to estimate the correct level of gain to be applied to a traffic channel and to hold this level constant throughout the time slot so that the equalizing and decoding section 26 can operate satisfactorily. In the present embodiment, the base station system provides a suitable control signal on line 40 to modify the clock rate so that during a traffic channel time slot, accumulator 4 is operative to store 8 words representing 8 samples of ADC 3 spaced evenly over the entire time slot, i.e. each sample is spaced 148/8 bit periods away from adjacent samples. At the end of the time slot, accumulator 4 provides the average value of the 8 words on bus 30 where the average value is stored in memory 11. Memory 11 is operative to store ten consecutive average values on bus 30 from ten consecutive time slots associated with any one mobile of each and every traffic channel of a time frame, and microprocessor 12 is operative to compute a further average value from the ten previous time slot signal amplitude levels to provide a further average value on bus 32 to converter 5. Thus, during operation of the system, immediately prior to reception of a traffic channel time slot, microprocessor 12 is operative to provide an average signal amplitude level on bus 32 to converter 5 to set the gain level of gain control unit 6 to a value for the duration of the time slot which is about to occur, so that the input signal in the time slot is attenuated by gain control unit by a value based upon the average signal amplitude in ten previous time slots. In this way, sudden variations in amplitude of the RF signal produced by the receiver are held within the dynamic range of the mulipath equalizer 26. Instantaneous amplitude and phase variations of the RF signal are presented to the equalizer to enable this to equalize out the multipath channel impulse response. The associated receiver is hence linear in operation for the duration of a timeslot.

What we claim is:

1. A receiver for a mobile telephone system, the receiver having a gain control means having a plurality of predetermined gain values, the gain control means being coupled to receive an input burst signal and being switchable in response to the value of a gain control signal between a plurality of gain values, detector means for detecting the amplitude of said input burst signal, averaging means responsive to said detector means for storing the value of the detected amplitude, and timing means responsive to said detector means and operative in response to the detection of said input burst signal by said detector means for timing a sequence of measurements of the amplitude of the input burst signal, said averaging means being operative to compute an average value of the amplitude and to provide a corresponding updated gain control signal for a subsequent time period.

2. A receiver according to claim 1, wherein said input burst signal comprises an RF signal.

3. A receiver according to claim 1, wherein said input burst signal comprises an IF signal.

4. A receiver according to claim 1, wherein the detector means comprises a logarithmic amplifier providing an output representative of decibel signal strength.

5. A receiver according to claim 4, wherein the output of the logarithmic amplifier is coupled to a fast analog to digital converter effective to provide a digital input indicative of the detected amplitude to said averaging means.

6. A receiver according to claim 1 wherein the averaging means comprises an accumulator arranged to store a plurality of samples of the detector means and to provide an output representing an average value of said samples.

7. A receiver according to claim 1 wherein the output of the averaging means is coupled to a converter which converts the output to a gain control signal suitable for application to said gain control means.

8. A receiver according to claim 9 wherein the converter comprises a look-up table.

9. A receiver according to claim 1 wherein the detector means includes a step detector for detecting a step increase of a predetermined amount in input signal strength, representing the beginning of an input burst signal.

10. A receiver according to claim 1 wherein the timing means is operative, in response to an output from the detector means indicating the detection of the beginning of an input burst signal and correspondingly the end of said output from the detector means, to time said sequence of measurements, the timing means including a counter for incrementing in response to clock signals for stepping said averaging means to store a sequence of detected amplitudes of said input signal, said timing means being coupled to the averaging means for holding the output of the averaging means for a predetermined period, whereupon the counter and the averaging means are reset.

11. A receiver according to claim 8 incorporated in the base station of a GSM system, and wherein the timing means is operative during a random access channel time slot to carry out a measurement sequence in eight consecutive bits of a start sequence of a random access burst signal.

12. A receiver according to claim 9 incorporated in a GSM system, and wherein the timing means is operative during a random access channel to commence a measurement sequence in response to detection of a said step increase, and if during said measurement sequence a further said step increase is detected, said timing means is operative to resent said averaging means and commence a fresh measurement sequence, thereby to resolve contention between mobiles contending for access.

13. A receiver according to claim 1 incorporated in a GSM system and wherein the timing means is operative in a first mode during a random access channel to carry out a sequence of measurements on the start sequence of a random access input signal, and is operative in a second mode during a traffic channel time slot to carry out a measurement sequence over the length of the time slot.

14. A receiver according to claim 13 wherein said averaging means includes a memory store and a processor for computing an average value based upon a plurality of previous input signal bursts.

15. A receiver according to claim 14 wherein said average value is based upon ten immediately previous time slots for the current traffic channel.

* * * * *